US012009232B2

(12) United States Patent
Wu et al.

(10) Patent No.: US 12,009,232 B2
(45) Date of Patent: Jun. 11, 2024

(54) HEATER LIFT ASSEMBLY SPRING DAMPER

(71) Applicant: Taiwan Semiconductor Manufacturing Co., Ltd., Hsinchu (TW)

(72) Inventors: Kai-Wen Wu, Hsinchu (TW); Chun-Ta Chen, Hsinchu (TW); Chin-Shen Hsieh, Hsinchu (TW); Cheng-Yi Huang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 41 days.

(21) Appl. No.: 17/843,602

(22) Filed: Jun. 17, 2022

(65) Prior Publication Data

US 2022/0319880 A1 Oct. 6, 2022

Related U.S. Application Data

(63) Continuation of application No. 16/870,499, filed on May 8, 2020, now Pat. No. 11,367,632.

(51) Int. Cl.
| | |
|---|---|
| *F27D 3/00* | (2006.01) |
| *F27B 17/00* | (2006.01) |
| *F27D 5/00* | (2006.01) |
| *H01L 21/324* | (2006.01) |
| *H01L 21/67* | (2006.01) |

(52) U.S. Cl.
CPC .... *H01L 21/67103* (2013.01); *F27B 17/0025* (2013.01); *F27D 3/0084* (2013.01); *F27D 5/0037* (2013.01); *H01L 21/324* (2013.01)

(58) Field of Classification Search
CPC . F24C 15/103; H05B 3/681; H01L 21/67778; H01L 21/67103; F27D 3/0084; F27D 5/0037; F27D 2003/0085; F27D 2003/0086; F27D 2003/0087
See application file for complete search history.

(56) References Cited

U.S. PATENT DOCUMENTS

| | | | | |
|---|---|---|---|---|
| 4,951,298 | A * | 8/1990 | Muller | H05B 7/102 373/67 |
| 6,483,082 | B1 | 11/2002 | Liao | |
| 6,645,303 | B2 * | 11/2003 | Frankel | G07F 17/3202 156/345.52 |
| 7,041,939 | B2 * | 5/2006 | Hosokawa | H01L 21/67115 118/724 |
| 7,700,898 | B2 * | 4/2010 | Seo | H01L 21/67757 219/390 |

(Continued)

FOREIGN PATENT DOCUMENTS

| | | | | |
|---|---|---|---|---|
| EP | 1202330 A2 * | 5/2002 | | C23C 16/4583 |
| EP | 1202330 A2 | 5/2002 | | |
| KR | 101463592 B1 * | 11/2014 | | |

*Primary Examiner* — Gregory A Wilson
(74) *Attorney, Agent, or Firm* — Duane Morris LLP

(57) ABSTRACT

In an embodiment, an apparatus comprising: a heater configured to heat a wafer located on a wafer staging area of the heater, the heater comprising a heater shaft extending below the wafer staging area; and a heater lift assembly comprising: a lift shaft configured to move the heater shaft in a vertical direction; a clamp that connects the heater shaft to the lift shaft; and a damper disposed on top of the clamp.

20 Claims, 9 Drawing Sheets

(56) References Cited

U.S. PATENT DOCUMENTS

| | | |
|---|---|---|
| 9,663,855 B2 | 5/2017 | Lee |
| 9,960,068 B1 * | 5/2018 | Konkola .............. C23C 16/4586 |
| 9,960,072 B2 * | 5/2018 | Coomer ............ H01L 21/68742 |
| 10,249,525 B2 | 4/2019 | Schaller |
| 11,367,632 B2 * | 6/2022 | Wu ................... H01L 21/68792 |

* cited by examiner

HEATER LIFT ASSEMBLY SPRING DAMPER

CROSS-REFERENCE TO RELATED APPLICATION

The present application is a continuation of U.S. patent application Ser. No. 16/870,499, filed on May 8, 2020, which is incorporated by reference herein in its entirety.

BACKGROUND

With advances of electronic products, semiconductor technology has been widely applied in manufacturing memories, central processing units (CPUs), liquid crystal displays (LCDs), light emission diodes (LEDs), laser diodes and other devices or chip sets. In order to achieve high-integration and high-speed requirements, dimensions of semiconductor integrated circuits have been reduced and various materials and techniques have been proposed to achieve these requirements and overcome obstacles during manufacturing. Controlling the conditions of processing wafers within chambers is an important part of semiconductor fabrication technology.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

DETAILED DESCRIPTION OF EXEMPLARY EMBODIMENTS

Figure 1:
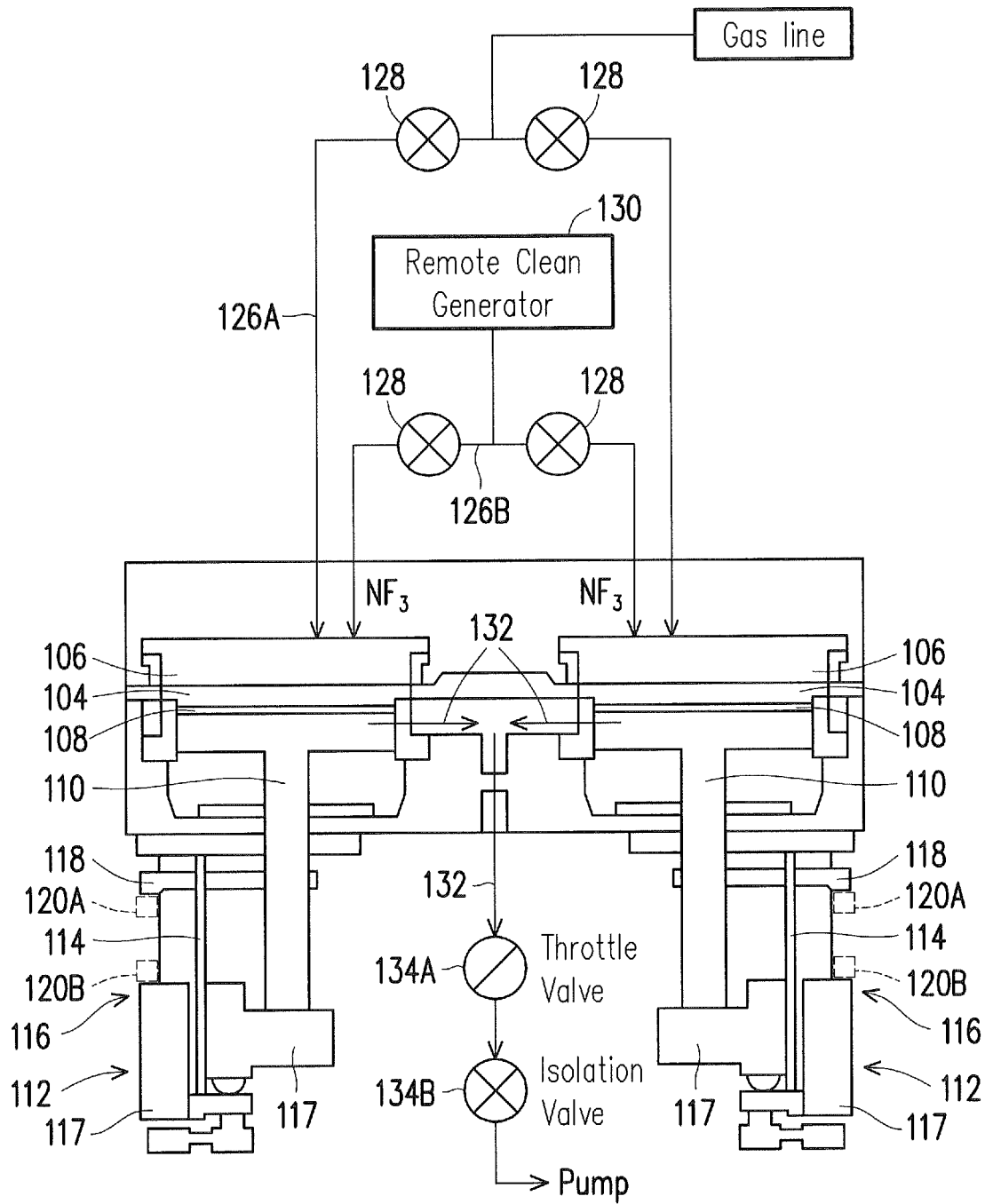
FIG. 1 is a vertical, cross-sectional illustration of a processing apparatus, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Systems and methods in accordance with various embodiments are directed to heater lift assembly spring dampers. Heater lift assembly spring dampers may be utilized to damp impacts due to movement associated with a heater lift assembly. The heater lift assembly may be a system that vertically moves a heater between a lower position (e.g., a lower loading/off-loading position) to onload or offload a wafer and a higher position (e.g., an upper processing position) to process the wafer. Also, the heater lift assembly, in the course of moving the heater, may also impart motion (e.g., via a clamp that connects the heater lift assembly to the heater) in a vertical orientation within a vertical work envelope as limited by a contact structure (e.g., a structure between physical surfaces that defines a maximum extent of movement for the heater lift assembly). Accordingly, in various embodiments, a spring damper may be utilized as a contact structure to damp the physical impact of the heater lift assembly reaching a physical extremity. Some exemplary effects and advantages provided by such various embodiments include avoiding ceramic heater rupture, which may occur when there is a failure of the heater bearing or a fastener. Thus, the various embodiments can reduce the damage rate of expensive ceramic heaters, reduce consequent wafer damage as a result of heater ruptures and avoid contamination of machines as a result of heater ruptures.

In certain embodiments, the heater may be configured to heat a wafer located on a wafer staging area of the heater pedestal. The heater lift assembly may include a lift shaft configured to lift the heater pedestal. More specifically, the lift shaft may be connected to the heater pedestal via a clamp such that vertical motion imparted by the lift shaft is imparted to the heater pedestal. An elastic spring may be located on the clamp as a contact structure of the heater lift assembly as a contact structure between physical surfaces that defines a maximum extent of movement for the heater lift assembly. In various embodiments, a leveling plate structure may be located above the heater lift assembly and with an upper contact structure (e.g., a vertical extension contact structure) to which a lower contact structure of the heater lift assembly may be configured to contact when the heater lift assembly is at an upper physical extremity. The leveling plate structure may laterally secure the heater in a lateral location (e.g., to substantially prevent the heater from moving in a side to side motion). In various embodiments, an elastic spring may be located at either one, or both, of an upper contact structure or a lower contact structure. For example, the lower contact structure may include a damper (e.g., an elastic spring) configured to contact the upper contact structure, which may or may not have a damper (e.g., an elastic spring). In the following discussions, an elastic spring will be described as an exemplary embodiment of a damper, in accordance with some embodiments.

In various embodiments, the elastic spring may include a biasable top piece disposed in a convex orientation on top of an elastic material. Thus, the biasable top piece (e.g., flexible spring portion) may extend across a flexible spring portion width. Also, this flexible spring portion width may be greater than a width of an upper contact structure (e.g., a vertical extension of the leveling plate structure). In particular embodiments, the flexible spring portion width may be along a clamp axis, along which the clamp may extend for a greatest extent. Also, the elastic spring may include a rigid securement end secured to the clamp via screws. For example, a screw may be configured to pass through the elastic spring, the clamp, and into a brace (e.g., the brace that connects the clamp to the heater) to secure the elastic spring to the clamp. In further embodiments, the elastic spring may be part of a set of two elastic springs on either side of the lift shaft.

In certain embodiments, the lift shaft of the heater lift assembly may include a threaded contour (e.g., a screw) that may be utilized to move the heater pedestal in a vertical direction via rotational motion of the lift shaft. This rotational motion may be imparted to the lift shaft via a motor. Also, the clamp may be utilized to connect the lift shaft to the brace that directly contacts the heater (e.g., to contact the heater via the heater's heater shaft that extends from under a staging area of the heater).

In various embodiments, the heater may be utilized in processes such as oxidation, diffusion, doping, annealing, and chemical vapor deposition (CVD). These processes may be performed in a processing apparatus. These processes are typically performed at elevated temperatures within heated controlled environments. CVD is a chemical vapor deposition process used to produce or deposit thin films of material on the wafer including without limitation metals, silicon dioxide, tungsten, silicon nitride, silicon oxynitride, and various dielectrics. These films may be deposited at temperatures greater than about 500° C. Such films may be used to form, ultra-shallow doped regions, premetal dielectric layers, intermetal dielectric layers, capping layers, oxide filling layers, or other layers.

FIG. 1 is a vertical, cross-sectional illustration of a processing apparatus 102, in accordance with some embodiments. In addition to being capable of depositing dielectric layers, the processing apparatus 102 may be configured for high temperature heating capabilities useful for performing reflow of deposited dielectric layers for planarization, or for driving in dopants from a deposited doped dielectric layer when forming ultra-shallow doped regions. Also, the processing apparatus 102 can provide efficient cleaning of various CVD chamber components and cleaning of wafer surfaces. Accordingly, the processing apparatus 102 may provide these multiple capabilities in situ in a single vacuum chamber 104 (e.g., enclosure). The multiple process steps may be performed in the single vacuum chamber 104 without having the wafer transferred out of that single vacuum chamber 104 into other external vacuum chambers. This may result in a lower moisture content on the wafers by eliminating opportunities to absorb moisture from the ambient air. Also, this may increase the dopant retention in the deposited dielectric layer. In addition, performing multiple process steps in a single chamber saves time to increase overall processing throughput.

In certain embodiments, the vacuum chamber 104 may also be referred to as a gas reaction area. A shower head may define a ceiling of the vacuum chamber 104 for dispersing reactive gases through perforated holes in the shower head to a wafer 108 that rests on the vertically movable heater 110 (also referred to as a wafer support pedestal or susceptor). Processing apparatus 102 further includes a heater lift assembly 112 for moving the heater 110. The heater lift assembly 112 may impart a controlled motion to the heater 110 between a lower loading/off-loading position and an upper processing position.

In certain embodiments, the heater lift assembly 112 may include a lift shaft 114 configured to lift the heater 110. More specifically, the lift shaft 114 may be connected to the heater 110 via a clamp 116 and brace 117 of the heater lift assembly 112 such that vertical motion imparted by the lift shaft 114 is imparted to the heater 110. In various embodiments, a leveling plate structure 118 may be located above the heater lift assembly 112 and with an upper contact structure 120A to which a lower contact structure 120B of the heater lift assembly may be configured to contact when the heater lift assembly 112 is at an upper physical extremity (e.g., maximum height). In various embodiments, an elastic spring may be located at either one, or both, of the upper contact structure 120A or the lower contact structure 120B. For example, the lower contact structure 120B may include an elastic spring configured to contact the upper contact structure 120A without an elastic spring. In various embodiments, the lower contact structure 120B may be an elastic spring located on the clamp 116.

As discussed in further detail below, in various embodiments, the elastic spring may include a biasable top piece disposed in a convex orientation on top of an elastic material. Also, the elastic spring may include a rigid securement end secured to the clamp via screws. For example, a screw may be configured to pass through the elastic spring, the clamp, and into the brace to secure the elastic spring to the clamp. In further embodiments, the elastic spring may be part of a set of two elastic springs on either side of the lift shaft.

The heater 110 may include resistively-heated components enclosed in a ceramic, such as aluminum nitride. For example, the surface of the heater 110 exposed to the vacuum chamber 104 may be of a ceramic material, such as aluminum oxide (e.g., $Al_2O_3$ or alumina) or aluminum nitride. Reactive and carrier gases may be supplied through supply lines 126A, 126B and delivered to the shower head 106. In certain embodiments, a processor may controllably operate one or more gate valves 128 to determine how much of a particular gas is to be sent to the shower head 106 for dispersing into the vacuum chamber 104. Accordingly, the term vacuum chamber may refer to a chamber that is typically in a vacuum or near vacuum state but may not necessarily always hold a vacuum state. In certain embodiments, gases may be received from an integral remote clean generator 130, which may itself have an inlet for receiving input gases. During deposition processing, a gas supplied to the shower head 106 may be vented toward the wafer surface to be uniformly distributed radially across the wafer surface, such as in a laminar flow. An exhaust system may exhaust the gas via exhaust piping 132 by a vacuum pump system via a throttle valve 134A and an isolation valve 134B. Thus, exhaust gases and residues are released via the exhaust piping 132 at a rate controlled via the throttle valve 134A and the isolation valve 134B.

In certain embodiments, a CVD process performed in the processing apparatus 102 may be a thermal, sub-atmospheric pressure process, also referred to as sub-atmospheric CVD (SACVD). As discussed earlier, thermal CVD processes supply reactive gases to the substrate surface where heat induced chemical reactions take place to produce a desired film. Accordingly, in the processing apparatus 102, heat may be distributed by the resistively-heated heater 110 that is capable of reaching temperatures as high as about 400° C. to about 800° C. Such heat distribution may provide uniform, rapid thermal heating of the wafer for effecting processes such as deposition, reflow, drive-in, cleaning, seasoning, gettering, and the like. In certain embodiments, a controlled plasma may be formed adjacent to the wafer by radio frequency (RF) energy applied to shower head 106 from an RF power supply connected to the shower head 106.

In various embodiments, the remote clean generator 130 may be configured for performing periodic cleaning of undesired deposition residue from various components of the vacuum chamber 104. In certain embodiments, the remote clean generator 130 may be a microwave plasma system configured to perform cleaning or etching of native oxides or residues from the surface of the wafer 108. Although gases input via supply line 126B from the remote clean generator 130 may be reactive cleaning gases in certain embodiments for creating a plasma to provide fluorine, chlorine, or other radicals, the remote clean generator 130 also may be adapted to deposit plasma enhanced CVD films by inputting deposition reactive gases into supply lines 126A, 126B. Generally, the remote clean generator 130 may receive gases, which are energized by microwave radiation to create a plasma with etching radicals which are then sent via supply line 126B for dispersion through the shower head 106.

In certain embodiments, the processing apparatus 102 may be a multi-chamber system with the capability to transfer a wafer between its chambers without breaking the vacuum and without having to expose the wafer to moisture or other contaminants outside the multi-chamber system. An advantage of the multi-chamber system is that different chambers in the multi-chamber system may be used for different purposes in the entire process. For example, one chamber may be used for deposition of oxides, another may be used for rapid thermal processing, and yet another may be used for oxide cleaning. The process may proceed uninterrupted within the multi-chamber system, thereby preventing contamination of wafers that often occurs when transferring wafers between various separate individual chambers (not in a multi-chamber system) for different parts of a process.

Figure 2:
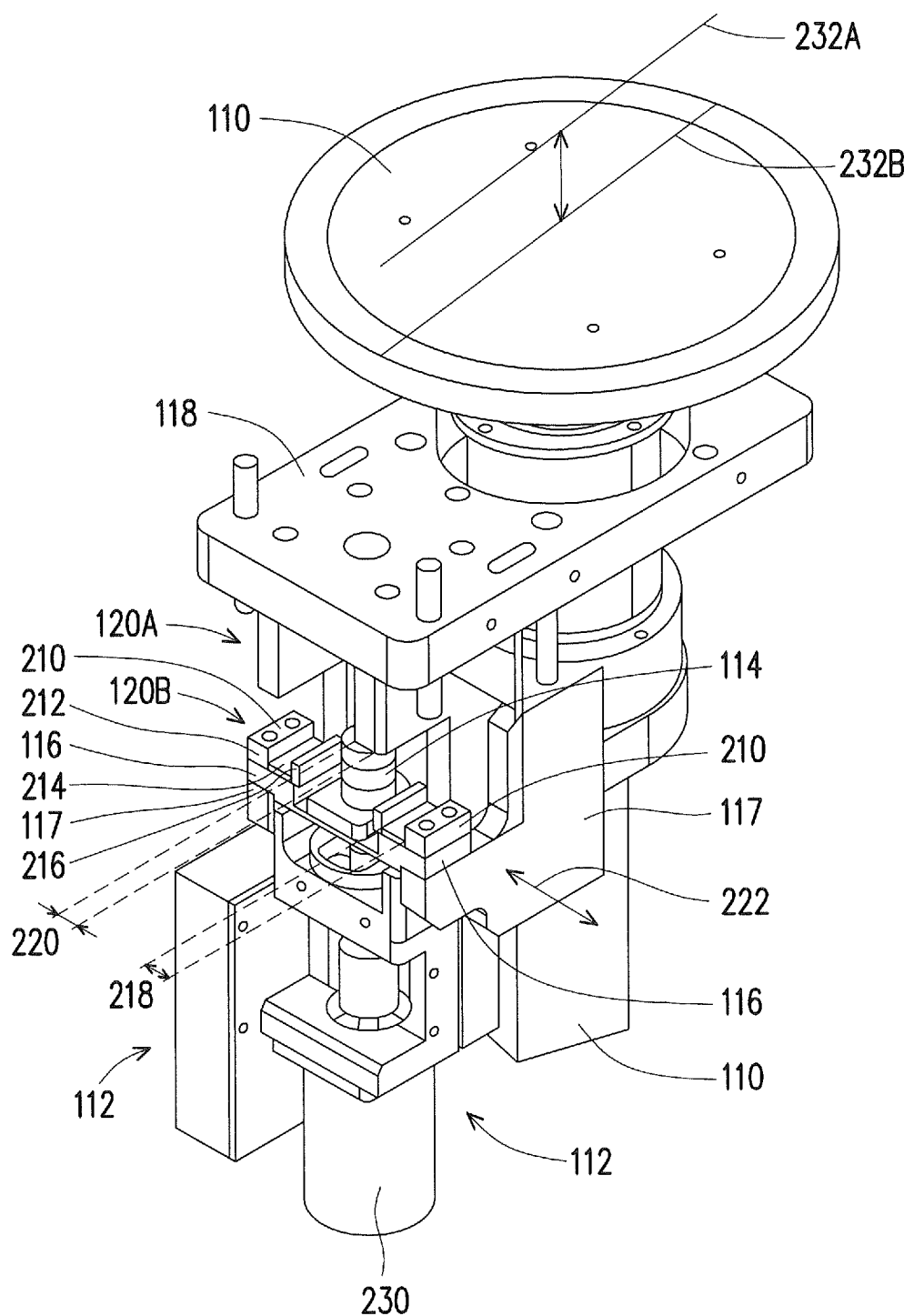
FIG. 2 is a perspective illustration of the heater lift assembly and adjacent structures, such as the leveling plate structure and heater, in accordance with some embodiments.

FIG. 2 is a perspective illustration of the heater lift assembly 112 and adjacent structures, such as the leveling plate structure 118 and heater 110, in accordance with some embodiments. The heater lift assembly 112, leveling plate structure 118, and heater 110 may be configured to lift a wafer into a processing position within a vacuum chamber and to heat the wafer during processing. Furthermore, the heater lift assembly 112 may be modified for use, or directly placed into, a variety of processing chambers other than a CVD chamber or SACVD chamber. For example, the heater lift assembly 112, leveling plate structure 118, and heater 110 may be used in a similar CVD chamber that generates plasma with RF or microwave power, a metal CVD (MCVD) chamber, or other semiconductor processing chambers.

Various features of heater lift assembly 112 shown in FIG. 2 are similar to features shown in FIG. 1 and, therefore, for purposes of brevity, the description of such features are not repeated here. Referring still to FIG. 2, in various embodiments, an elastic spring 210 may be located at the lower contact structure 120B. For example, the lower contact structure 120B may include an elastic spring 210 configured to contact the upper contact structure 120A, which may be rigid without an elastic structure such as the elastic spring 210. In various embodiments, the elastic spring 210 may be located on the clamp 116 as a contact structure of the heater lift assembly 112 between physical surfaces that define a maximum extent of upward movement for the heater lift assembly 112 (e.g., for the clamp 116 and elastic spring 210 of the heater lift assembly 112).

The elastic spring 210 may include a rigid securement end 212 secured to the clamp via screws. For example, a screw may be configured to pass through the elastic spring 210, the clamp 116, and into the brace 117 to secure the elastic spring 210 to the clamp. The rigid securement end 212 may be adjacent a flexible spring portion 214. The flexible spring portion 214 may include a biasable top piece disposed in a convex orientation on top of an elastic material. The flexible spring portion 214 may also be adjacent to a rigid extreme end 216. The rigid extreme end 216 and the rigid securement end 212 may both be ends that sandwich the flexible spring portion 214 between them. In further embodiments, the elastic spring 210 may be part of a set of two elastic springs 210 on either side of the lift shaft 114.

In various embodiments, the flexible spring portion 214 may extend across a flexible spring portion width 218. Also, this flexible spring portion width 218 may be greater than an upper contact structure width 220 (e.g., a vertical extension of the leveling plate structure). In particular embodiments, the flexible spring portion width 218 may be along a clamp axis 222, along which the clamp may extend for a greatest extent.

In certain embodiments, the lift shaft 114 of the heater lift assembly 112 may include a threaded contour (e.g., a screw) that may be utilized to move the heater 110 in a vertical direction via rotational motion of the lift shaft 114. This rotational motion may be imparted to the lift shaft 114 via a motor 230. Accordingly, the heater lift assembly 112 may impart a controlled motion to the heater 110 between a lower loading/off-loading position (as represented by a diameter 232A of the heater 110 at the lower loading/off-loading position) and an upper processing position (as represented by a diameter 232B of the heater 110 at the upper processing position).

The heater 110 (and the wafer supported thereon) can be controllably moved between a lower loading/off-loading position (as represented by a diameter 232A of the heater 110 at the lower loading/off-loading position) where they are substantially aligned with a port for egress and ingress of a wafer and an upper processing position (as represented by a diameter 232B of the heater 110 at the upper processing position) beneath a shower head. In certain embodiments, the diameter 232A, 232B may be about 6 inches to about 12 inches (or about 150 to about 300 mm) for large size wafers and about 3 inches to about 5 inches (or about 75 to about 130 mm) for small size wafers. The heater 110 may be made of a process-compatible material that is capable of withstanding relatively high processing temperatures (e.g., to about 600° C. or about 800° C. or higher).

The motor 230 may represent any of a variety of driving mechanisms, including a pneumatic cylinder, controllable motor or the like. For example, the motor may be a stepper motor with a suitable gear drive that operates to vertically drive the lift shaft 114 in controlled increments between the loading/unloading and processing positions. In various embodiments, the heater lift assembly 112 may include the motor 230, the clamp 116, the elastic spring 210, the lift shaft 114, and the brace 117.

Figure 3A:
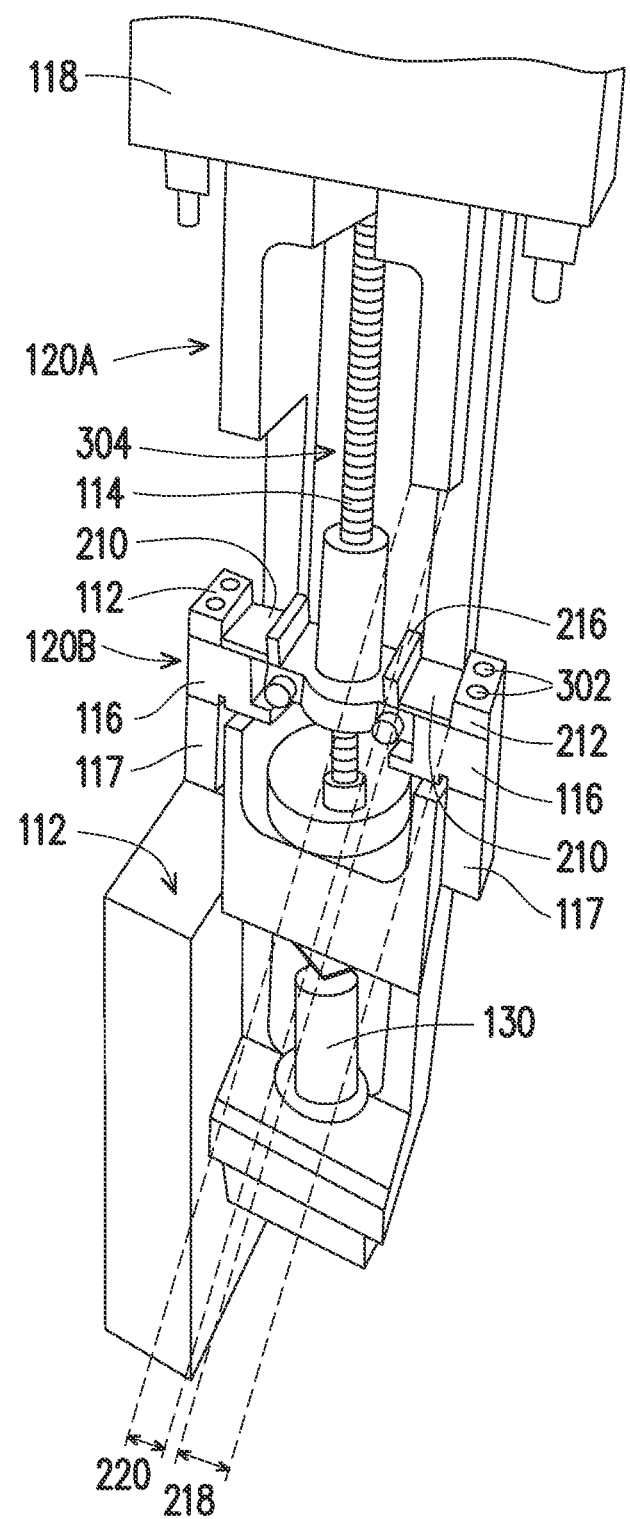
FIG. 3A is a right side perspective illustration of the heater lift assembly and the leveling plate structure, in accordance with some embodiments.

FIG. 3A is a right side perspective illustration of the heater lift assembly 112 and the leveling plate structure 118, in accordance with some embodiments. Various features of the heater lift assembly 112 shown in FIG. 3A are similar to features shown in FIGS. 1 and 2. Therefore, for purposes of brevity, the description of such features are not repeated here. Referring to FIG. 3A, in accordance with some embodiments, the elastic spring 210 may include a rigid securement end 212 secured to the clamp via screws 302. For example, the screws 302 may be configured to pass through the elastic spring 210, the clamp 116, and into the brace 117 to secure the elastic spring 210 to the clamp 116. The rigid securement end 212 may be adjacent the flexible spring portion 214. Additionally, in certain embodiments, the lift shaft 114 of the heater lift assembly 112 may include a threaded contour 304 (e.g., a screw) that may be utilized to move a heater in a vertical direction via rotational motion of the lift shaft 114. As discussed above, this rotational motion may be imparted to the lift shaft 114 via a motor 230.

Figure 3B:
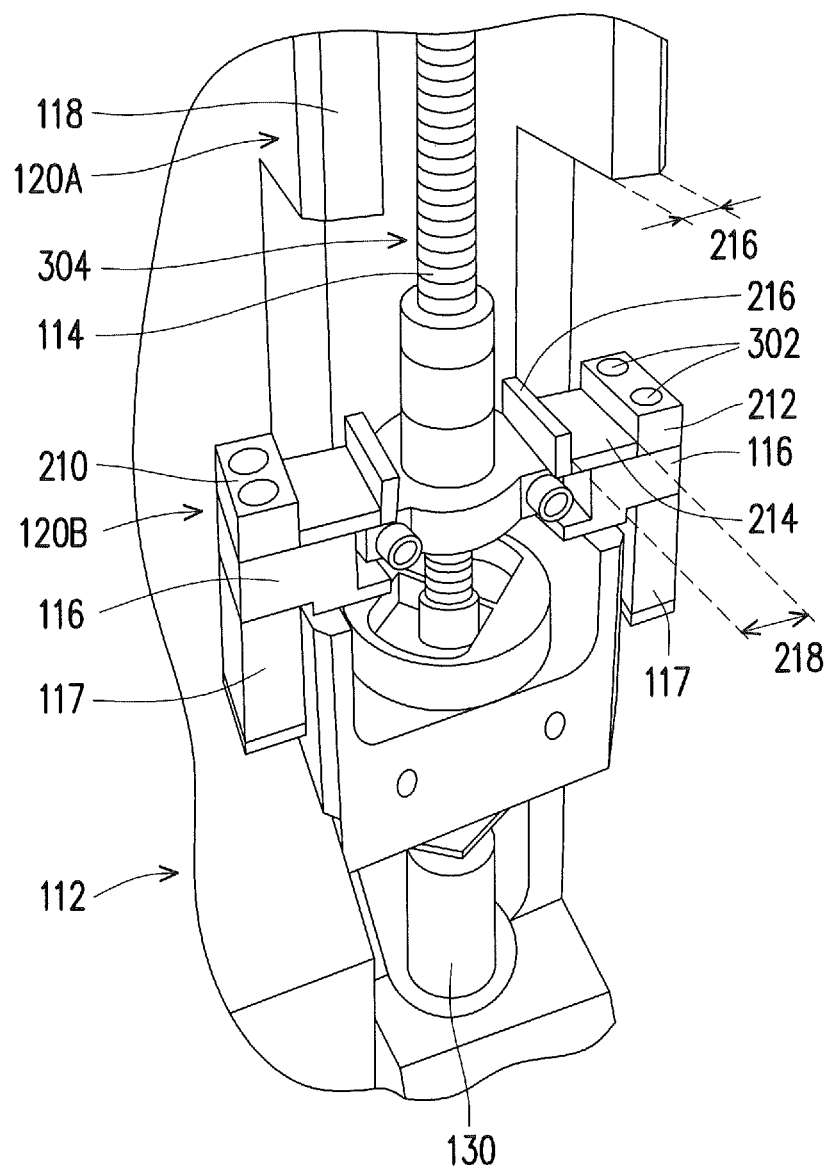
FIG. 3B is a left side perspective illustration of the heater lift assembly and the leveling plate structure 118, in accordance with some embodiments.

FIG. 3B is a left side perspective view of the heater lift assembly 112 and the leveling plate structure 118, in accordance with some embodiments. Various features of heater lift assembly 112 shown in FIG. 3B are similar to features shown in FIGS. 1, 2 and 3A, as described above. Therefore, for purposes of brevity, the description of such features are not repeated here. As further illustrated in FIG. 3B, the flexible spring portion 214 may extend across a flexible spring portion width 218. In some embodiments, this flexible spring portion width 218 may be greater than an upper contact structure width 220 (e.g., a vertical extension of the leveling plate structure). In particular embodiments, the flexible spring portion width 218 may be along a clamp axis 222, along which the clamp may extend for a greatest extent.

Figure 4A:
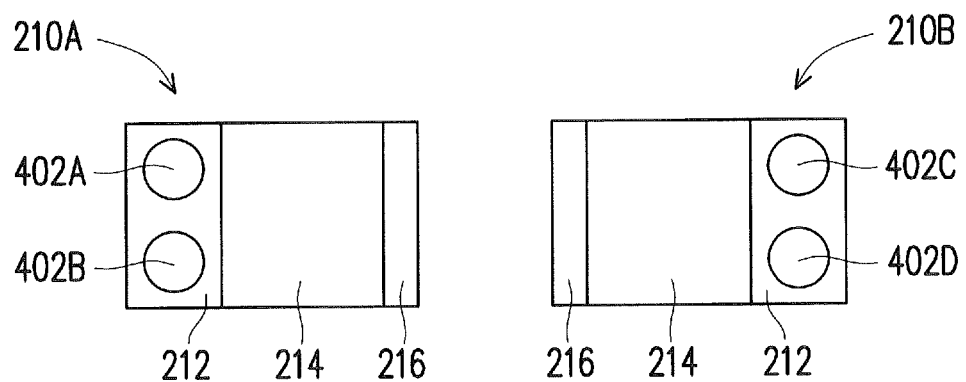
FIG. 4A illustrates a left elastic spring and a right elastic spring, in accordance with certain embodiments.

FIG. 4A illustrates a left elastic spring 210A and a right elastic spring 210B, in accordance with certain embodiments. Each of the elastic springs 210A, 210B may include a rigid securement end 212 secured to the clamp via screws. These screws may be configured to extend through a first left elastic spring screw hole 402A, a second left elastic spring screw hole 402B, a first right elastic spring screw hole 402C, and a second right elastic spring screw hole 402D. The correspondence of these screw holes to screw holes of a clamp will be discussed further below in connection with FIG. 4B. For example, returning to FIG. 4A, the respective screws may be configured to pass through the elastic spring 210, the clamp, and into the brace to secure the elastic spring to the clamp via respective screw holes 402A, 402B, 402C, 402D. The rigid securement end 212 may be adjacent a flexible spring portion 214. The flexible spring portion 214 may include a biasable top piece disposed in a convex orientation on top of an elastic material. The flexible spring portion 214 may also be adjacent to a rigid extreme end 216.

The rigid extreme end 216 and the rigid securement end 212 may be ends that sandwich the flexible spring portion 214 between them.

Figure 4B:
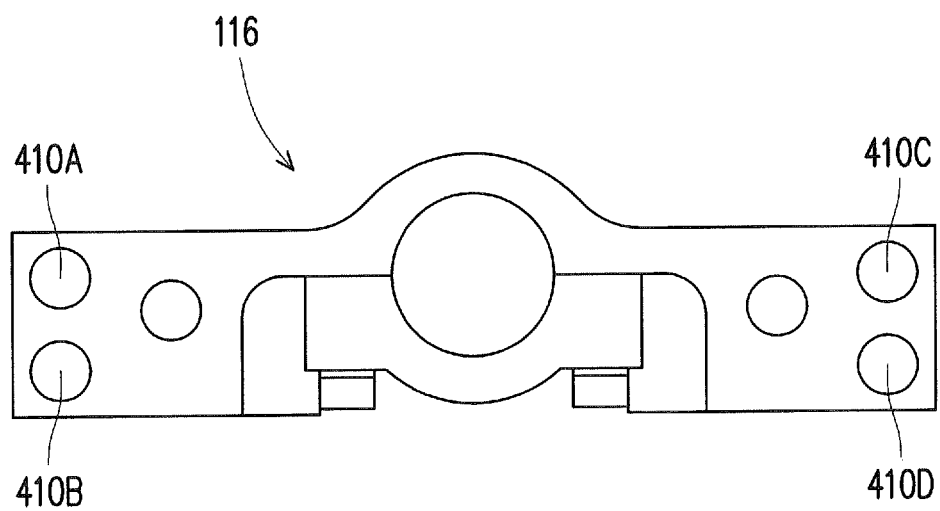
FIG. 4B illustrates the clamp on which the left elastic spring and the right elastic spring may be disposed upon, in accordance with certain embodiments.

FIG. 4B illustrates the clamp 116 on which the left elastic spring and the right elastic spring may be disposed upon, in accordance with certain embodiments. With reference to FIG. 4A, each of the elastic springs 210A, 210B may include a rigid securement end 212 secured to the clamp 116 via screws. These screws may be configured to extend through the first left elastic spring screw hole 402A, the second left elastic spring screw hole 402B, the first right elastic spring screw hole 402C, and the second right elastic spring screw hole 402D, respectively. Referring to FIG. 4B, a screw that passes through the first left elastic spring screw hole 402A may also be configured to pass through a first left clamp screw hole 410A. Also, a screw that passes through the second left elastic spring screw hole 402B may also be configured to pass through a second left clamp screw hole 410B. Also, a screw that passes through the first right elastic spring screw hole 402C may also be configured to pass through a first right clamp screw hole 410C. Lastly, a screw that passes through the second right elastic spring screw hole 402D may also be configured to pass through a second right clamp screw hole 410D.

Figure 5A:
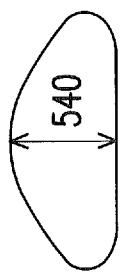
FIG. 5A is a side view diagram of an elastic spring, in accordance with some embodiments.

FIG. 5A is a side view diagram of an elastic spring 210, in accordance with some embodiments. The elastic spring 210 may include a rigid securement end width 502 at the rigid securement end. In certain embodiments, the rigid securement end width 502 may be from about 10 mm to about 20 mm, or of about 12.5 mm. The rigid securement end may also include a screw width 504, which may be width of a region configured to receive a threaded portion of a screw that may pass through the rigid securement end. In certain embodiments, the screw width 504 may be from about 1 mm to about 10 mm, or of about 4.9 mm. The rigid securement end may also include a rigid securement end height 506, which may be a height of the rigid securement end. In certain embodiments, the rigid securement end height 506 may be from about 1 mm to about 10 mm, or of about 7 mm. The rigid securement end may also include a screw head width 510, which may be width of region configured to receive a head of a screw that may pass through the rigid securement end. In certain embodiments, the screw head width 510 may be from about 1.5 mm to about 15 mm, or of about 8 mm. In certain embodiments, the elastic spring 210 (exclusive of the biasable top piece or underlying elastic material) may be made of 6061 grade aluminum.

The flexible spring portion may include a flexible spring portion width 512, which may be the width of the flexible spring portion. In certain embodiments, the flexible spring portion width 512 may be from about 10 mm to about 20 mm, or of about 17.5 mm. The flexible spring portion may include a biasable top piece disposed in a convex orientation on top of an elastic material, as will be discussed in further detail below. This biasable top piece and elastic material may sit on a flexible spring portion spine, which may have a flexible spring portion spine width 514. In certain embodiments, the flexible spring portion spine width 514 may be from about 0.1 mm to about 10 mm, or of about 2 mm. Additionally, the rigid extreme end 216 may include a rigid extreme end width 516. In certain embodiments, the rigid extreme end width 516 may be from about 1 mm to about 10 mm, or of about 4 mm. The height of the rigid extreme end may be the same as the rigid securement end height 506 in certain embodiments.

Figure 5B:
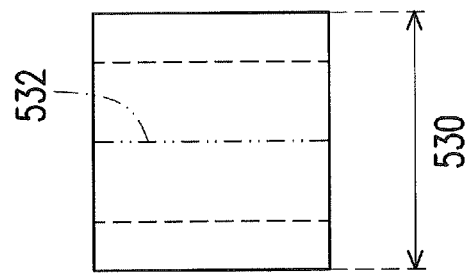
FIG. 5B is a plan view diagram of the elastic spring, in accordance with some embodiments.

FIG. 5B is a plan view diagram of the elastic spring 210, in accordance with some embodiments. The elastic spring 210 of FIG. 5A may be the same as the elastic spring 210 of FIG. 5B but as viewed in a different perspective. The elastic spring 210 may include an elastic spring length 520. In certain embodiments, the elastic spring length 520 may be from about 20 mm to about 30 mm, or of about 25 mm. Also, the elastic spring 210 may include an overall elastic spring width 522. In certain embodiments, the overall elastic spring width 522 may be from about 20 mm to about 50 mm, or of about 34 mm.

Figure 5C:
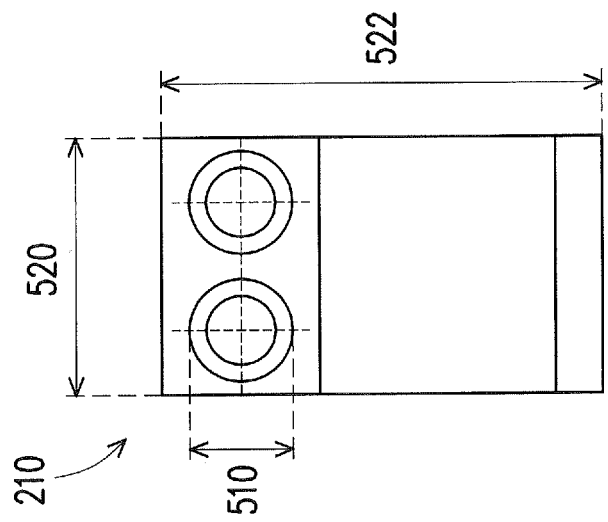
FIG. 5C is a plan view diagram of the biasable top piece, in accordance with some embodiments.

FIG. 5C is a plan view diagram of the biasable top piece, in accordance with some embodiments. The biasable top piece may span across a biasable top piece length 530 that is parallel to the elastic spring length 520 of FIG. 5B. In certain embodiments, the biasable top piece length 530 may be from about 20 mm to about 30 mm, or of about 25.5 mm. This biasable top piece may have a peak (e.g., a greatest height or distance from the flexible spring portion spine at a center of the biasable top piece length 530 (e.g., along a center line 532 of the biasable top piece).

Figure 5D:
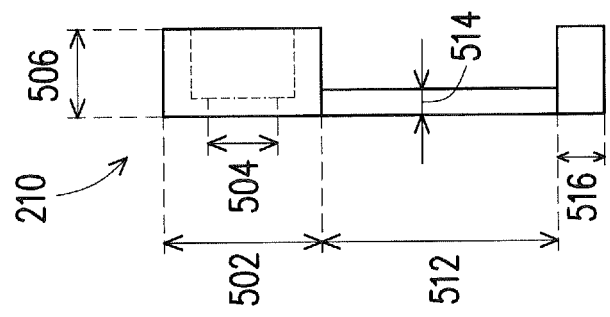
FIG. 5D is a side view diagram of the biasable top piece, in accordance with some embodiments.

FIG. 5D is a side view diagram of the biasable top piece, in accordance with some embodiments. The biasable top piece may span a biasable top piece height 540 along the center line 532 referenced above in connection with FIG. 5C. In certain embodiments, this biasable top piece height 540 may be from about 2 mm to about 6 mm, or of about 4.2 mm.

Figure 6A:
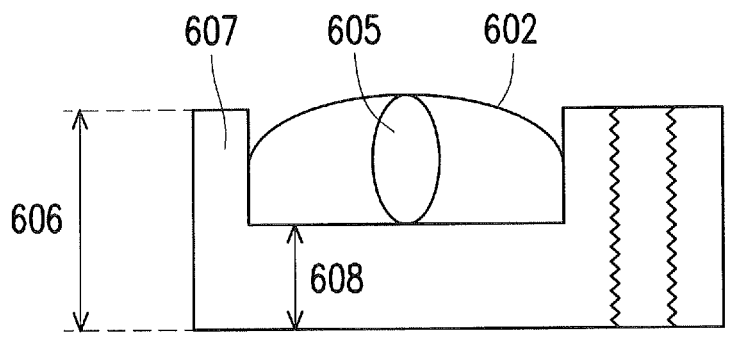
FIG. 6A illustrates a side view of an unbiased biasable top piece, in accordance with some embodiments.

FIG. 6A illustrates a side view of an unbiased biasable top piece 602, in accordance with some embodiments. The illustrated unbiased biasable top piece 602 may be of an alternate embodiment where the biasable top piece 602 has a center line peak (e.g., a greatest height or distance from the flexible spring portion spine along a center line of the biasable top piece) that is orthogonal to an overall elastic spring width (introduced above). Also, a solid elastic material 605 (e.g., rubber) may be filled in between the bias able top piece 602 and the flexible spring portion spine 607. In certain embodiments, this solid elastic material 605 may be in the form of a sphere or cylinder. This biasable top piece and elastic material may sit on a flexible spring portion spine, which may have a flexible spring portion spine height 608. In certain embodiments, the flexible spring portion spine height 608 may be from about 0.1 mm to about 10 mm, or of about 2 mm. In various embodiments, the unbiased biasable top piece 602 may span a maximum biasable top piece height from the flexible spring portion spine of about from about 1 mm to about 10 mm, or of about 2 mm in certain embodiments. Also, the elastic spring may also include a rigid securement end height, which may be a height of the elastic spring, of from about 2 mm to about 10 mm, or of about 4 mm in certain embodiments. In certain embodiments, the biasable top piece 602 may be made of stainless steel.

Figure 6B:
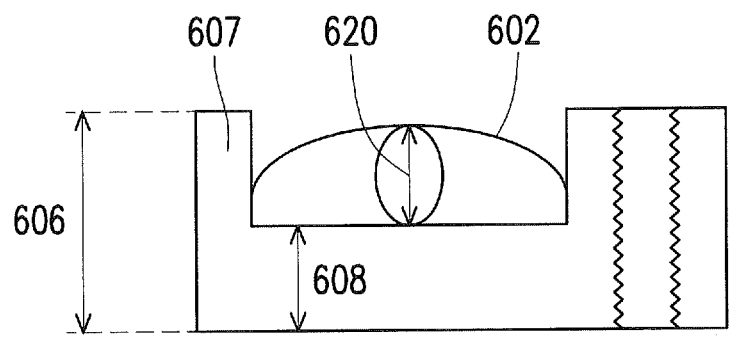
FIG. 6B illustrates a side view of a medium biased biasable top piece, in accordance with some embodiments.

FIG. 6B illustrates a side view of a medium biased biasable top piece 602, in accordance with some embodiments. The biasable top piece 602 may be the same as that of FIG. 6A. Returning to FIG. 6B, the medium biased biasable top piece 602 may span a maximum biasable top piece height 620 of about 1.6 mm when biased with about 5 kilogram-force (Kgf).

Figure 6C:
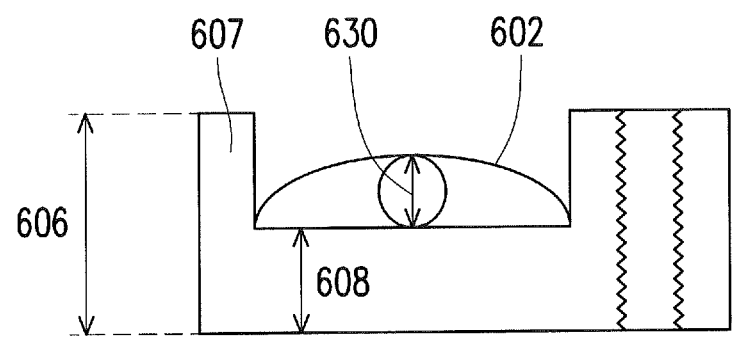
FIG. 6C illustrates a side view of a high biased biasable top piece, in accordance with some embodiments.

FIG. 6C illustrates a side view of a high biased biasable top piece 602, in accordance with some embodiments. The bias able top piece 602 may be the same as that of FIG. 6A. Returning to FIG. 6C, the high biased biasable top piece 602 may span a maximum biasable top piece height 630 of about 1 mm when biased with about 20 kilogram-force (Kgf).

Figure 7:
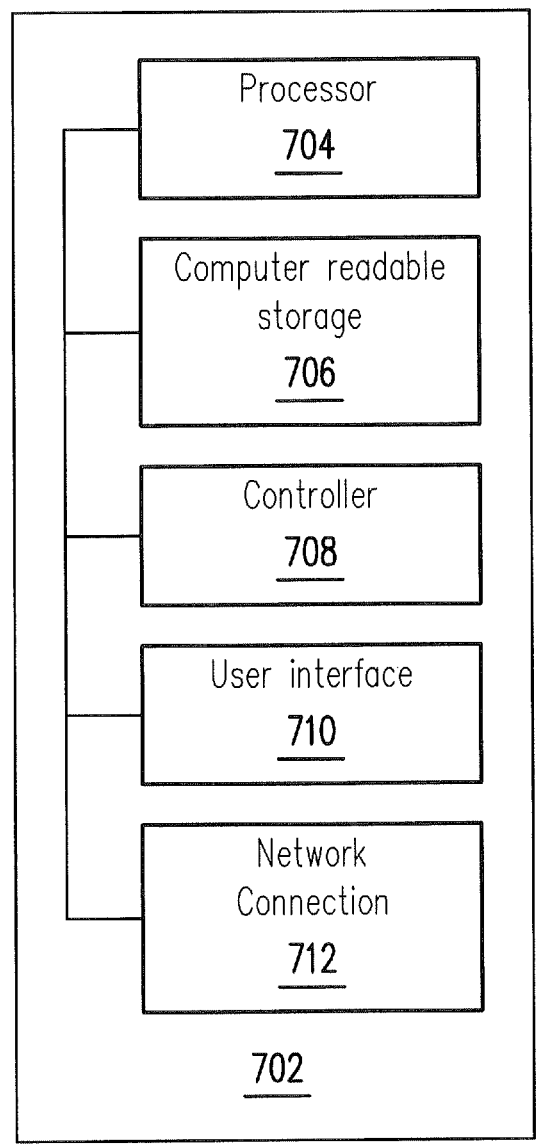
FIG. 7 is a block diagram of a processing apparatus functional module, in accordance with some embodiments.

FIG. 7 is a block diagram of a processing apparatus functional module 702, in accordance with some embodiments. The processing apparatus functional module 702 may be part of a processing apparatus. The processing apparatus functional module may include a processor 704. In certain embodiments, the processor 704 may controllably operate one or more gate valves to determine how much of a particular gas is to be sent to a shower head for dispersing into a vacuum chamber. In additional embodiments, the processor 704 may controllably operate a lift shaft to move a heater in a vertical direction. In further embodiments, the processor 704 may be implemented as one or more processors.

The processor 704 may be operatively connected to a computer readable storage module 706 (e.g., a memory and/or data store), a controller module 708 (e.g., a controller), a user interface module 710 (e.g., a user interface), and a network connection module 712 (e.g., network interface). In some embodiments, the computer readable storage module 706 may include processing apparatus logic that may configure the processor 704 to perform various processes discussed herein. The computer readable storage may also store data, such as identifiers for a wafer, identifiers for a processing apparatus, identifiers for particular gas or plasma, and any other parameter or information that may be utilized to perform in the various processes discussed herein.

The processing apparatus functional module 702 may include a controller module 708. The controller module 708 may be configured to control various physical apparatuses that control movement or functionality for a processing apparatus, heater, and the like. For example, the controller module 708 may be configured to control movement or functionality for at least one of a robotic arm that moves a wafer, an actuator for a valve, a lift shaft, and the like. For example, the controller module 708 may control a motor or actuator that may move or activate at least one of a robotic arm, heater lift assembly, functionality of a processing apparatus, and the like. The controller may be controlled by the processor and may carry out aspects of the various processes discussed herein.

The processing apparatus functional module 702 may also include the user interface module 710. The user interface module may include any type of interface for input and/or output to an operator of the processing apparatus functional module 702, including, but not limited to, a monitor, a laptop computer, a tablet, or a mobile device, etc.

The network connection module 712 may facilitate a network connection of the processing apparatus functional module 702 with various devices and/or components of the processing apparatus functional module 702 that may communicate (e.g., send signals, messages, instructions, or data) within or external to the processing apparatus functional module 702. In certain embodiments, the network connection module 712 may facilitate a physical connection, such as a line or a bus. In other embodiments, the network connection module 712 may facilitate a wireless connection, such as over a wireless local area network (WLAN) by using a transmitter, receiver, and/or transceiver. For example, the network connection module 712 may facilitate a wireless or wired connection with the processor 704, the computer readable storage 706, and the controller 708.

Figure 8:
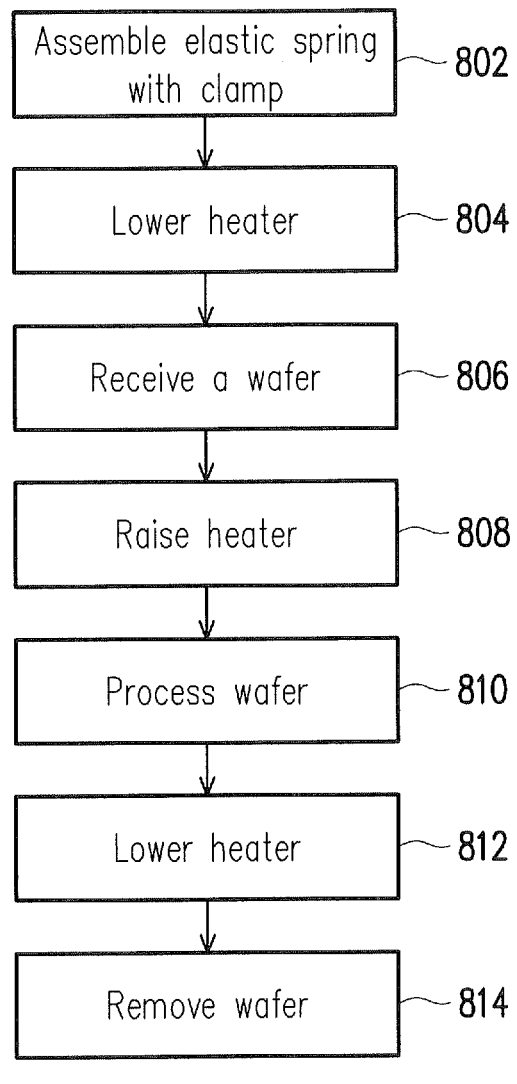
FIG. 8 is a flow chart of a processing apparatus process, in accordance with some embodiments.

FIG. 8 is a flow chart of a processing apparatus process 800, in accordance with some embodiments. The processing apparatus process 800, may be performed using components of a processing apparatus, as introduced above. It is noted that the process 800 is merely an example, and is not intended to limit the present disclosure. Accordingly, it is understood that additional operations maybe provided before, during, and after the process 800 of FIG. 8, certain operations may be omitted, certain operations may be performed concurrently with other operations, and that some other operations may only be briefly described herein.

At operation 802, an elastic spring may be assembled with a clamp. The elastic spring may be assembled by being screwed into a clamp via screw holes passing through the elastic spring, the clamp, and into the brace of a heater lift assembly. For example, an elastic spring may include a rigid securement end configured for securement to the clamp via screws. These screws may be configured to extend through respective elastic spring screw holes and through respective clamp screw holes. Stated another way, the elastic spring may be assembled by having a screw or other securement device pass through the elastic spring, the clamp, and into the brace to secure the elastic spring to the clamp via respective screw holes.

In certain embodiments, the elastic spring (by being on the clamp) may be located a lower contact structure. For example, the lower contact structure may be an elastic spring that may be located on the clamp as a contact structure of the heater lift assembly between physical surfaces that defines a maximum extent of upward movement for the heater lift assembly.

At operation 804, a heater may be lowered to a lower loading/off-loading position. The clamp may be utilized to connect the lift shaft to a brace that directly contacts the heater shaft. In certain embodiments, a lift shaft of the heater lift assembly may include a threaded contour (e.g., a screw) that may be utilized to move the heater in a vertical direction via rotational motion of the lift shaft. More specifically, the lift shaft may move the clamp, which may also move the connected brace, and which may also move the connected heater. Accordingly, the clamp may include a mating contour to the threaded contour of the lift shaft such that rotation of the lift shaft may vertically move the clamp. This rotational motion may be imparted to the lift shaft 114 via a motor. Accordingly, the heater lift assembly 112 may impart a controlled motion to the heater 110 between a lower loading/off-loading position and an upper processing position. More specifically, the heater (and the wafer supported thereon) can be controllably moved between a lower loading/off-loading position where they are substantially aligned with a port for egress and ingress of a wafer and an upper processing position beneath a shower head.

The motor may represent any of a variety of driving mechanisms, including a pneumatic cylinder, controllable motor or the like. For example, the motor may be a stepper motor with a suitable gear drive that operates to vertically drive the lift shaft in controlled increments between the loading/unloading and processing positions.

At operation 806, a wafer may be received on the heater at the lower loading/off-loading position. At the lower loading/off-loading position, the heater may be substantially aligned with a port for egress and ingress of a wafer. A robotic arm holding the wafer may reach through the port and deposit the wafer on top of the heater aligned with the port.

At operation 808, the heater may be raised to the upper processing position. The upper processing position may be closer to a shower head than the lower loading/off-loading position.

At operation 810, the wafer may be processed at the upper processing position and within the vacuum chamber between the heater and the shower head. In certain embodiments, the processing apparatus may multiple capabilities in situ in a single vacuum chamber. The vacuum chamber may also be referred to as a gas reaction area. A shower head may define a ceiling of the vacuum chamber for dispersing reactive gases in the course of processing the wafer through perforated holes in plate to a wafer that rests on the vertically movable heater.

One example of processing the wafer at the upper processing position and within the vacuum chamber is CVD processing. CVD is a chemical vapor deposition process used to produce or deposit thin films of material on the wafer including without limitation metals, silicon dioxide, tungsten, silicon nitride, silicon oxynitride, and various dielectrics. These films may be deposited at temperatures greater than about 500° C. Such films may be used to form, ultra-shallow doped regions, premetal dielectric layers, intermetal dielectric layers, capping layers, oxide filling layers, or other layers.

At operation 812, the heater may be lowered to the lower loading/off-loading position once the processing of the wafer at operation 810 is completed. At operation 814, the wafer may be removed. At the lower loading/off-loading position, the heater may be substantially aligned with a port for egress and ingress of a wafer. A robotic arm holding the wafer may reach through the port and retrieve the wafer on top of the heater aligned with the port.

In an embodiment, an apparatus comprising: a heater configured to heat a wafer located on a wafer staging area of the heater, the heater comprising a heater shaft extending below the wafer staging area; and a heater lift assembly comprising: a lift shaft configured to move the heater shaft in a vertical direction; a clamp that connects the heater shaft to the lift shaft; and an elastic spring disposed on top of the clamp.

In another embodiment, an apparatus includes: an enclosure comprising: a shower head; and a heater below the shower head, the heater configured to heat a wafer located on a wafer staging area of the heater, the heater comprising a heater shaft extending below the wafer staging area; and a heater lift assembly comprising: a lift shaft configured to move the heater shaft in a vertical direction via a rotational motion; a clamp that connects the heater shaft to the lift shaft; and an elastic spring disposed on top of the clamp.

In another embodiment, a method includes: assembling an elastic spring to a clamp, wherein the clamp connects a lift shaft to a heater shaft, wherein the lift shaft is configured to move the heater shaft in a vertical direction, and wherein the heater shaft extends from below a wafer staging area of a heater configured to heat a wafer located on the wafer staging area; lowering the heater to a lowered position; receiving the wafer at the lowered position; raising the heater to a raised position; and processing the wafer at the raised position.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the invention.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module"), or any combination of these techniques. To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure.

Furthermore, a person of ordinary skill in the art would understand that various illustrative logical blocks, modules, devices, components and circuits described herein can be implemented within or performed by an integrated circuit (IC) that can include a general purpose processor, a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A general purpose processor can be a microprocessor, but in the alternative, the processor can be any conventional processor, controller, or state machine. A processor can also be implemented as a combination of computing devices, e.g., a combination of a DSP and a microprocessor, a plurality of microprocessors, one or more microprocessors in conjunction with a DSP core, or any other suitable configuration to perform the functions described herein.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Additionally, persons of skill in the art would be enabled to configure functional entities to perform the operations described herein after reading the present disclosure. The term "configured" as used herein with respect to a specified operation or function refers to a system, device, component, circuit, structure, machine, etc. that is physically or virtually constructed, programmed and/or arranged to perform the specified operation or function.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. An apparatus, comprising:
   a heater configured to heat a wafer disposed on a top surface of the heater; and
   a heater lift assembly comprising:
      a lift shaft coupled to the heater and configured to move the heater in a vertical direction;
      a clamp that couples the heater to the lift shaft such that rotational motion of the lift shaft moves the heater in the vertical direction; and
      a damper disposed on a top surface of the clamp, wherein the damper comprises an elastic spring that comprises an elastic material,
   wherein the elastic spring comprise two opposing rigid ends that sandwich the elastic material, and wherein the elastic spring has a width that is greater than a contact structure width of a contact structure disposed over the elastic spring and configured to contact the elastic spring when the clamp is moved to a maximum vertical location.

2. The apparatus of claim 1, further comprising:
   a heater shaft extending below the top surface of the heater; and
   a leveling plate configured to laterally secure the heater shaft in a lateral orientation, wherein the leveling plate comprises a contact structure disposed over the damper.

3. The apparatus of claim 2, wherein the contact structure is configured to contact the damper when the clamp is moved toward a maximum vertical location.

4. The apparatus of claim 1, wherein the elastic spring comprises a biasable top piece disposed in a convex orientation on top of the elastic material.

5. The apparatus of claim 4, wherein the biasable top piece is configured to contact the elastic spring when the clamp is moved to a maximum vertical location.

6. The apparatus of claim 5, wherein the clamp extends for a greatest extent along a clamp axis, and the elastic spring width is along the clamp axis.

7. The apparatus of claim 1, wherein the elastic spring comprises a biasable top piece disposed in a convex orientation on top of the elastic material, and wherein the biasable top piece has a flexible spring portion width that is greater than a contact structure width of a contact structure disposed over the elastic spring and configured to contact the elastic spring when the clamp is moved to a maximum vertical location.

8. An apparatus, comprising:
   an enclosure configured to process a wafer therein;
   a heater disposed within the enclosure, the heater comprising a wafer stage configured to support the wafer and heat the wafer; and a heater lift assembly comprising:
   a lift shaft coupled to the heater and configured to move the heater in a vertical direction via a rotational motion;
   a clamp that couples the heater to the lift shaft such that rotational motion of the lift shaft moves the heater in the vertical direction; and
   a damper disposed on top of the clamp, wherein the damper is configured to engage a contact structure extending downwardly from within the enclosure when the clamp is moved toward a maximum vertical location, wherein the damper comprises an elastic spring comprising an elastic material.

9. The apparatus of claim 8, wherein the elastic spring comprises a rigid end secured to the clamp via screws.

10. The apparatus of claim 8, wherein the elastic spring comprise two opposing rigid ends that sandwich a flexible spring portion.

11. The apparatus of claim 10, wherein the elastic spring comprises a biasable top piece, and wherein the biasable top piece is configured to have a height of approximately 10 millimeters (mm) in an unbiased state and height of approximately 1 mm in a maximum biased state.

12. The apparatus of claim 10, wherein the flexible spring portion has a width that is greater than a contact structure width of a contact structure disposed over the elastic spring and configured to contact the elastic spring when the clamp is moved to a maximum vertical location.

13. The apparatus of claim 12, wherein the flexible spring portion width is in the range of 10 to 20 millimeters.

14. The apparatus of claim 8, wherein the damper is part of a set of two dampers disposed on opposite sides of the lift shaft.

15. A method, comprising:
providing a damper on a clamp of a wafer processing apparatus, wherein the clamp couples a lift shaft to a heater, wherein the lift shaft is configured to move the heater in a vertical direction, and wherein the damper comprises an elastic spring comprising an elastic material;
lowering the heater to a lowered position;
receiving the wafer at the lowered position;
raising the heater to a raised position, wherein the damper is configured to damp impacts due to raising the heater; and
processing the wafer at the raised position,
wherein the elastic spring comprises a biasable top piece, and wherein the biasable top piece has a flexible spring portion width that is greater than a contact structure width of a contact structure disposed over the elastic spring and configured to contact the elastic spring when the clamp is moved to a maximum vertical location.

16. The method of claim 15, further comprising:
contacting the damper with a contact structure of a leveling plate configured to laterally secure the heater shaft.

17. The method of claim 16, wherein the elastic spring comprises a rigid end secured to the clamp via screws.

18. The method of claim 17, wherein the biasable top piece is configured to have a height of approximately 10 millimeters (mm) in an unbiased state and height of approximately 1 mm in a maximum biased state.

19. The method of claim 17, wherein the biasable top piece is disposed in a convex orientation on top of the elastic material.

20. The method of claim 19, wherein the flexible spring portion width is in the range of 10 to 20 millimeters.

* * * * *